(12) United States Patent
Yang et al.

(10) Patent No.: US 10,990,026 B2
(45) Date of Patent: Apr. 27, 2021

(54) LITHOGRAPHY APPARATUS AND CLEANING METHOD THEREOF

(71) Applicant: TAIWAN SEMICONDUCTOR MANUFACTURING CO., LTD., Hsinchu (TW)

(72) Inventors: Chi Yang, Taichung (TW); Sheng-Ta Lin, Miaoli County (TW); Shang-Chieh Chien, New Taipei (TW); Li-Jui Chen, Hsinchu (TW); Po-Chung Cheng, Chiayi County (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 16/181,111

(22) Filed: Nov. 5, 2018

(65) Prior Publication Data

US 2020/0057393 A1 Feb. 20, 2020

Related U.S. Application Data

(60) Provisional application No. 62/718,396, filed on Aug. 14, 2018.

(51) Int. Cl.
*G03F 7/20* (2006.01)

(52) U.S. Cl.
CPC ............................ *G03F 7/70925* (2013.01)

(58) Field of Classification Search
CPC .................................................. G03F 7/70925
See application file for complete search history.

(56) References Cited

U.S. PATENT DOCUMENTS

| | | | |
|---|---|---|---|
| 2006/0285091 A1* | 12/2006 | Parekh | G02B 27/0006 355/30 |
| 2007/0145297 A1* | 6/2007 | Freriks | G03F 7/70925 250/492.2 |
| 2009/0014027 A1* | 1/2009 | Schriever | G03F 7/70483 134/1.1 |
| 2009/0224179 A1* | 9/2009 | Shirai | G03F 7/70908 250/492.1 |
| 2011/0188011 A1* | 8/2011 | Ehm | G03F 7/70925 355/30 |
| 2012/0223257 A1* | 9/2012 | Nagai | B23K 26/36 250/504 R |
| 2014/0253716 A1* | 9/2014 | Saito | H05G 2/006 348/87 |
| 2017/0036252 A1* | 2/2017 | De Dea | B08B 5/02 |
| 2019/0155179 A1* | 5/2019 | Wu | G03F 7/70175 |
| 2020/0037427 A1* | 1/2020 | Yang | G03F 7/2004 |
| 2020/0073250 A1* | 3/2020 | Zi | G03F 7/70925 |
| 2020/0103758 A1* | 4/2020 | Chen | G03F 7/70175 |
| 2020/0331038 A1* | 10/2020 | Wu | B08B 7/04 |

* cited by examiner

*Primary Examiner* — Deoram Persaud
(74) *Attorney, Agent, or Firm* — Maschoff Brennan

(57) ABSTRACT

A method for cleaning a lithography apparatus is provided. The method includes flowing a major cleaning agent in volume over a reflective surface of a collector of the lithography apparatus; and flowing a minor cleaning agent in volume intermittently over the reflective surface of the collector, so as to clean the reflective surface of the collector.

20 Claims, 2 Drawing Sheets

LITHOGRAPHY APPARATUS AND CLEANING METHOD THEREOF

PRIORITY CLAIM AND CROSS-REFERENCE

This application claims priority to U.S. Provisional Application Ser. No. 62/718,396, filed Aug. 14, 2018, which is herein incorporated by reference.

BACKGROUND

A lithography process generally used in the fabrication of a semiconductor device, in which a light beam is used to transfer various element patterns of a circuit design on various layers on a substrate. The element patterns are further processed to create devices and circuits forming an IC device. With advancements in IC design and fabrication technologies, the element patterns are getting much smaller for producing a smaller and efficient IC device. A light source with a smaller wavelength, such as an extreme ultraviolet (EUV) light beam, is required to achieve a better resolution for the element patterns.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
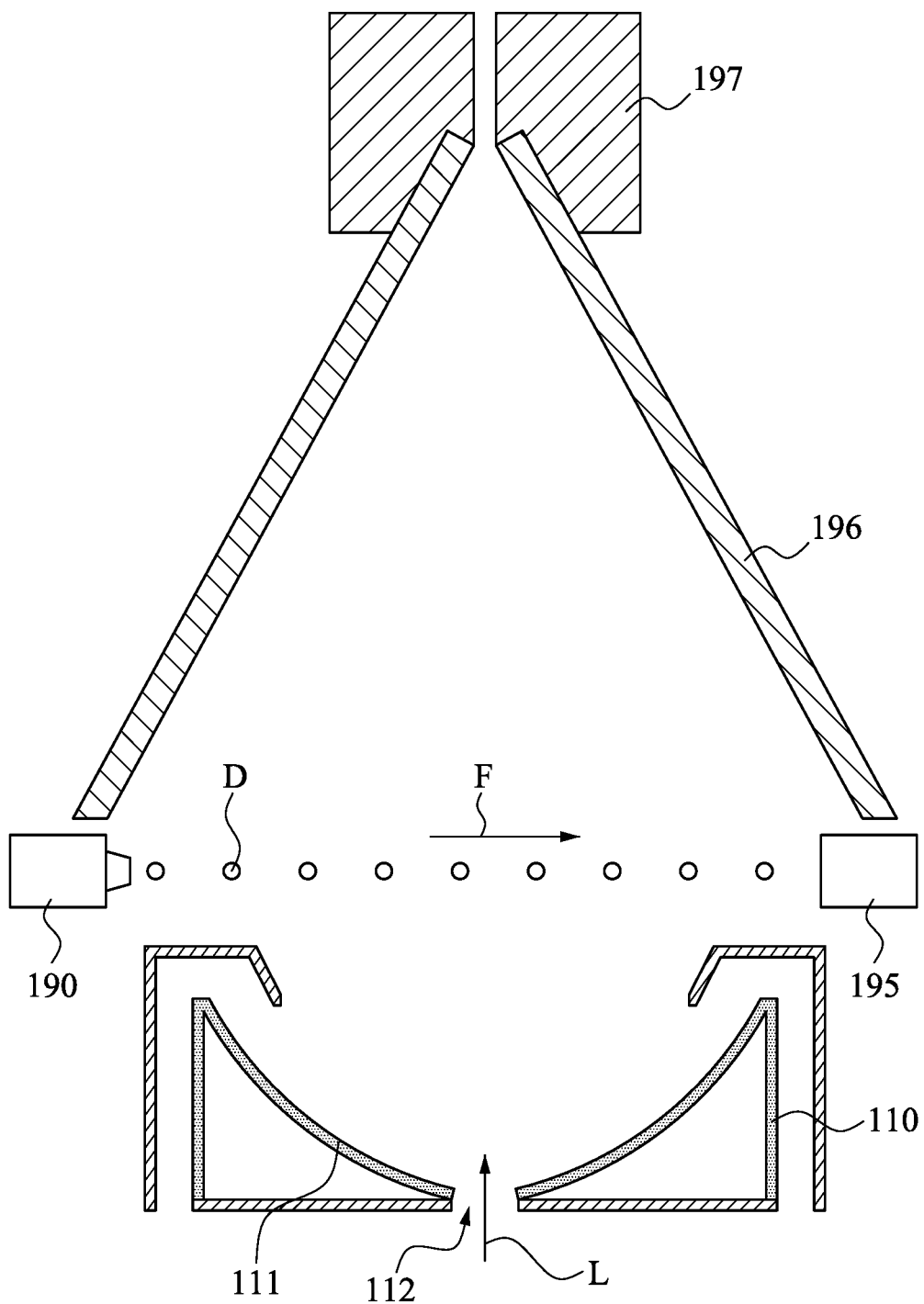
FIG. 1 is a schematic view of a lithography apparatus in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Reference is made to FIG. 1. FIG. 1 is a schematic view of a lithography apparatus 100 in accordance with some embodiments of the present disclosure. As shown in FIG. 1, a lithography apparatus 100 is provided in this disclosure. The lithography apparatus 100 includes a collector 110, a scanner 197, and a cone 196. The cone 196 is located between the collector 110 and the scanner 197. A vacuum environment is formed inside the cone 196 for the operation of the lithography apparatus 100.

Moreover, the lithography apparatus 100 further includes a droplet generator 190 and a drainage structure 195. The droplet generator 190 and the drainage structure 195 are opposite to each other. In some embodiments, the droplet generator 190 and the drainage structure 195 are located substantially between the cone 196 and the collector 110.

In addition, the collector 110 includes a reflective surface 111. The reflective surface 111 is concave towards the scanner 197. The collector 110 has an opening 112. The opening 112 is located at or near a center of the reflective surface 111. The droplet generator 190 is configured to emit solder droplets D at a high frequency, ranging from about 49.5 kHz to about 50.5 kHz, towards the drainage structure 195 along a direction F. In other words, the droplet generator 190 emit about 49,500 to about 50,500 solder droplets D per second towards the drainage structure 196. Meanwhile, the drainage structure 195 is configured to receive the solder droplets D emitted from the droplet generator 190.

During the operation of the lithography apparatus 100, an extreme ultraviolet (EUV) light is generated by a laser produced plasma (LPP) process. For example, in some embodiments, a laser beam L is guided to pass through the opening 112 of the collector 110 in a direction to which the reflective surface 111 is curved, i.e., towards the scanner 197. In practical applications, for example, the laser beam L can be a carbon dioxide ($CO_2$) laser beam. However, this does not intend to limit the present disclosure. To be more specific, the laser beam L is directed on a path intersecting to a locus of each of the solder droplets D flying from the droplet generator 190 towards the drainage structure 196. Meanwhile, in some embodiments, the frequency of the generation of the laser beam L is set to be the same as the frequency of the emission of the solder droplets D by the droplet generator 190 towards the drainage structure 196. When the laser beam L illuminates the solder droplets D flying from the droplet generator 190 to the drainage structure 196, illumination of each of the solder droplets D by the laser beam L produces a hot dense plasma layer on the solder droplet D. The hot dense plasma then excites the remaining portion of the solder droplet D to emit photons for generating the EUV light. The solder droplets D are vaporized and the photons are then collected by the collector 110 and reflected by the reflective surface 111 to a series of reflectors and mirrors (not shown for illustrative convenience), which direct the EUV light for use in the lithography process. In practical applications, the material of the solder droplets D can be, for example, stannum (Sn) or xenon (Xe).

During the plasma generation and vaporization of the solder droplets D as mentioned above, due to droplet uncertainty, solder particles (not shown in FIG. 1), or debris, as contaminants may be produced and deposited subsequently on the reflective surface 111 of the collector 110. Thus, the reflectivity of the reflective surface 111 of the collector 110 is gradually reduced as the lithography apparatus 100 is operated. As a result, the lifetime of the collector 110 is thus reduced.

Figure 2:
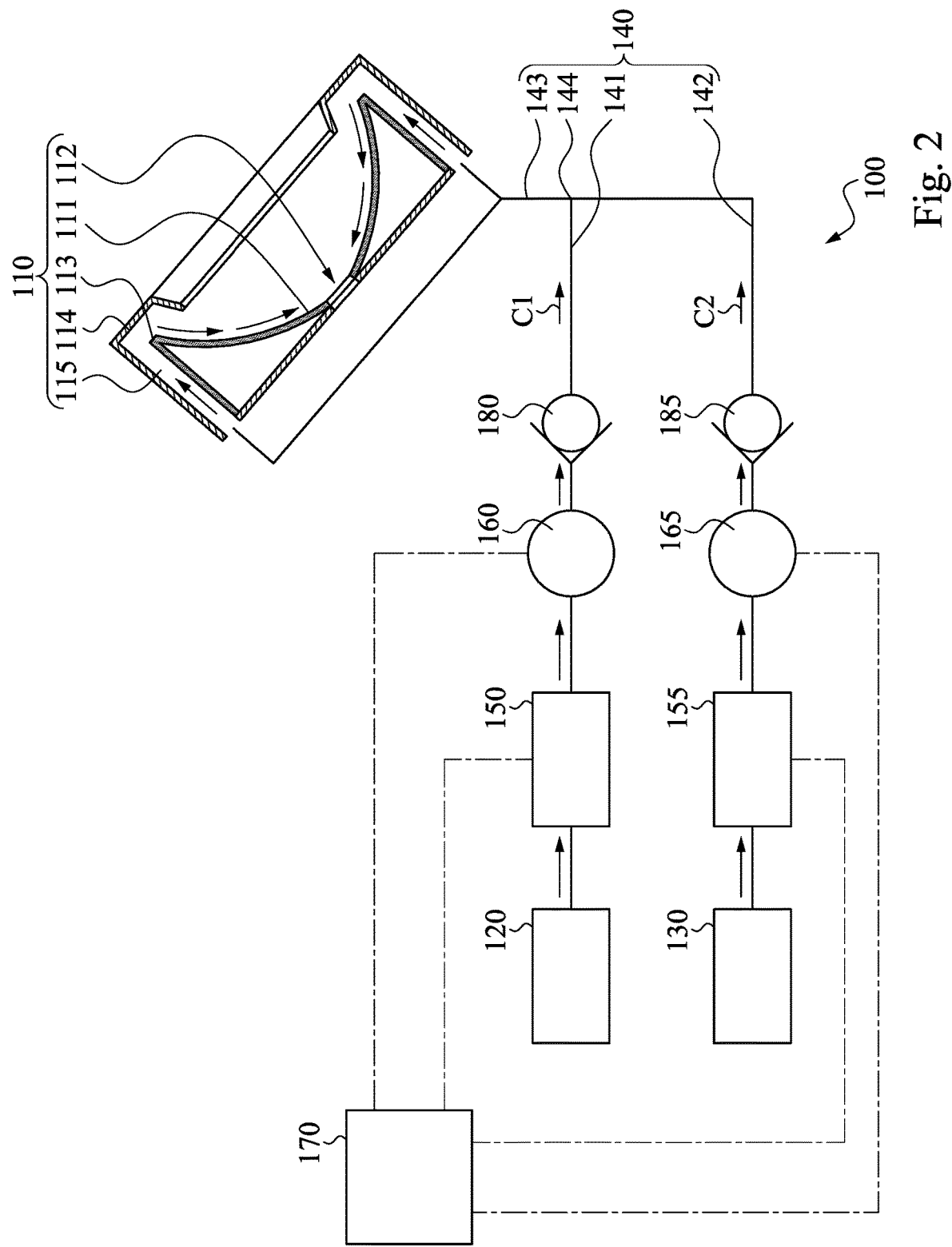
FIG. 2 is a cross-sectional view of a collector in FIG. 1, in which the collector is connected with a first gas source and a second gas source.

Reference is made to FIG. 2. FIG. 2 is a cross-sectional view of the collector 110 in FIG. 1, in which the collector 110 is connected with a first gas source 120 and a second gas source 130. As shown in FIG. 2, the collector 110 has a perimeter 113. The perimeter 113 is located around and communicated with the reflective surface 111. The collector 110 further has an inlet 115. The inlet 115 is located on the perimeter 113. In some embodiments, the inlet 115 is disposed at the periphery of the collector 110. In addition, in some embodiments, the lithography apparatus 100 includes a first gas source 120 and a second gas source 130. Please be noted that the first gas source 120 and the second gas source 130 are not shown in FIG. 1 for illustrative convenience. As shown in FIG. 2, the first gas source 120 is communicated with the inlet 115 of the collector 110. The first gas source 120 is configured to supply a first cleaning agent C1 to the reflective surface 111 through the inlet 115 and the perimeter 113 of the collector 110. On the other hand, the second gas source 130 is communicated with the inlet 115 of the collector 110. The second gas source 130 is configured to supply a second cleaning agent C2 intermittently to the reflective surface 111 through the inlet 115 and the perimeter 113 of the collector 110.

In some embodiments, the collector 110 further includes a guiding plate 114. As shown in FIG. 2, the guiding plate 114 is disposed adjacent to the perimeter 113 of the collector 110. In this way, when the first cleaning agent C1 and/or the second cleaning agent C2 flow through the inlet 115 to reach the region around the perimeter 113 of the collector 110, the first cleaning agent C1 and/or the second cleaning agent C2 are effectively guided towards the reflective surface 111 of the collector 110 by the guiding plate 114. The first cleaning agent C1 and the second cleaning agent C2 are utilized to clean the solder particles, or debris, as contaminants deposited on the reflective surface 111 of the collector 110 after the operation of the lithography apparatus 100, as mentioned above.

In some embodiments, the first cleaning agent C1 is hydrogen gas. During the operation of the lithography apparatus 100, for instance, in case that the material of the solder droplet D is stannum (Sn), the hydrogen gas as the first cleaning agent C1 reacts with the solder particles, or debris, as contaminants deposited on the reflective surface 111 of the collector 110 under the effect of the EUV light generated. Consequently, a chemical product of stannene ($SnH_4$) is formed, according to the following chemical equation:

$$Sn(s) + 2H(g) \rightarrow SnH_4(g)$$

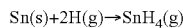

Since the solid stannum (Sn) is reacted with the hydrogen gas under the effect of the EUV light generated to form the gaseous stannene ($SnH_4$) as the chemical product, the stannene ($SnH_4$) in the gas state can be drown out away from the collector 110 and thus the lithography apparatus 100 in an easy manner, facilitating the cleaning of the reflective surface 111 of the collector 110 in order to recover the reflectivity of the collector 110. In some embodiments, according to the actual situations, a pump (not shown) can be employed to pump the gaseous stannene ($SnH_4$) out of the lithography apparatus 100.

As mentioned above, the lithography apparatus 100 includes the second gas source 130, and the second gas source 130 is configured to supply the second cleaning agent C2 intermittently to the reflective surface 111 through the inlet 115 and the perimeter 113 of the collector 110. In some embodiments, the second cleaning agent C2 is extreme clean dry air (XCDA), which means the percentage of composition of moisture and impurity in the air as the second cleaning agent C2 is extremely low.

In some embodiments, the second cleaning agent C2 is oxygen gas. Practically speaking, for example, the second gas source 130 supplies oxygen gas intermittently to the reflective surface 111 through the inlet 115 and the perimeter 113 of the collector 110, so as to increase the cleaning effect for the reflective surface 111 of the collector 110 and thus increase the lifetime of the collector 110. Below is an example illustrating the pattern of intermittent supply of oxygen gas as the second cleaning agent C2 to clean the reflective surface 111 of the collector 110 throughout an accumulated operation of the lithography apparatus 100.

In practical applications, when the lithography apparatus 100 has been operated with the solder droplets D emitted by the droplet generator 190 being less than a specific cumulative counts, for example, of about $4.5 \times 10^9$ to about $7 \times 10^9$ counts, only the first gas source 120 is turned on to supply hydrogen gas as the first cleaning agent C1 to clean the reflective surface 111 of the collector 110 while the second gas source 130 is turned off for a period of time. This period of time is related to the cumulative counts of the solder droplets D provided by the droplet generator 190, which will be discussed below. In this way, the excessive supply of the second cleaning agent C2 is effectively avoided.

After the lithography apparatus 100 has been operated with about $4.5 \times 10^9$ to $7 \times 10^9$ cumulative counts of the solder droplets D provided by the droplet generator 190, for example, the second gas source 130 is also turned on to supply oxygen gas as the second cleaning agent C2. That is, both the first gas source 120 and the second gas source 130 are turned on, and both hydrogen gas and oxygen gas are supplied, in order to increase the cleaning effect for the reflective surface 111 of the collector 110, so as to recover the reflectivity of the collector 110 and increase the lifetime of the collector 110.

Subsequently, after the lithography apparatus 100 has been further operated with about $7 \times 10^9$ to about $9.6 \times 10^9$ cumulative counts of the solder droplets D emitted by the droplet generator 190, for example, the second gas source 130 is turned off for a period of time. Again, this period of time is related to the cumulative counts of the solder droplets D provided by the droplet generator 190, which is discussed below. In this scenario, only the first gas source 120 is turned on to supply hydrogen gas as the first cleaning agent C1 to clean the reflective surface 111 of the collector 110. In this way, the excessive supply of the second cleaning agent C2 is effectively avoided.

Subsequently, after the lithography apparatus 100 has been further operated with about $9.6 \times 10^9$ to about $10.8 \times 10^9$ cumulative counts of the solder droplets D emitted by the droplet generator 190, for example, the second gas source 130 is turned on again to supply oxygen gas as the second cleaning agent C2. That is, both the first gas source 120 and the second gas source 130 are turned on, and both hydrogen gas and oxygen gas are supplied, in order to increase the cleaning effect for the reflective surface 111 of the collector 110, so as to recover the reflectivity of the collector 110 and increase the lifetime of the collector 110.

Subsequently, after the lithography apparatus 100 has been further operated with about $10.8 \times 10^9$ to about $12.3 \times 10^9$ cumulative counts of the solder droplets D emitted by the droplet generator 190, for example, the second gas source 130 is turned off again for a period of time. That is, only the first gas source 120 is turned on to supply hydrogen gas as the first cleaning agent C1 to clean the reflective surface 111 of the collector 110. In this way, the excessive supply of the second cleaning agent C2 is effectively avoided.

Subsequently, after the lithography apparatus 100 has been further operated with about $12.3 \times 10^9$ to about $13.1 \times 10^9$ cumulative counts of the solder droplets D emitted by the droplet generator 190, for example, the second gas source 130 is turned on again to supply oxygen gas as the second cleaning agent C2. That is, both the first gas source 120 and the second gas source 130 are turned on, and both hydrogen gas and oxygen gas are supplied, in order to increase the cleaning effect for the reflective surface 111 of the collector 110, so as to recover the reflectivity of the collector 110 and increase the lifetime of the collector 110.

The operational procedure mentioned above with the counts of the solder droplets D emitted by the droplet generator 190 gradually accumulated to about $12.3 \times 10^9$ to about $13.1 \times 10^9$ counts, for example, illustrates the pattern of intermittent supply of oxygen gas as the second cleaning agent C2 to clean the reflective surface 111 of the collector 110, so as to recover the reflectivity of the collector 110 and increase the lifetime of the collector 110. However, it is noted that the cumulative counts of the solder droplets D stated above at which the second gas source 130 is turned on or off are only illustrative and are not to limit the claimed scope. A person having ordinary skill in the art of the present disclosure may flexibly determine the cumulative counts of the solder droplets D at which the second gas source 130 is turned on or off according to the actual situation.

Furthermore, in order to have a better cleaning effect, when both the first gas source 120 and the second gas source 130 are turned on with the same period of time, the total amount of the second cleaning agent C2, i.e., oxygen gas, supplied to the reflective surface 111 of the collector 110 is smaller than the total amount of the first cleaning agent C1, i.e., hydrogen gas, supplied to the reflective surface 111 of the collector 110. In other words, hydrogen gas as the first cleaning agent C1 is the major cleaning agent in volume and oxygen gas as the second cleaning agent C2 is the minor cleaning agent in volume to clean the reflective surface 111 of the collector 110. In some embodiments, the flow rate of hydrogen gas supplied to the reflective surface 111 of the collector 110 is about 50,000 to about 60,000 times more than the flow rate of oxygen gas supplied to the reflective surface 111 of the collector 110.

Structurally speaking, as shown in FIG. 2, the lithography apparatus 100 includes a duct assembly 140. The duct assembly 140 is not shown in FIG. 1 for illustrative convenience. In some embodiments, the duct assembly 140 connects the first gas source 120 and the second gas source 130 to the inlet 115 of the collector 110. To be more specific, the duct assembly 140 includes a first duct 141, a second duct 142 and a third duct 143. The first duct 141 connects to the first gas source 120, the second duct 142 connects to the second gas source 130, and the third duct 143 connects the first duct 141 and the second duct 142 to the inlet 115 of the collector 110. Moreover, the first duct 141, the second duct 142 and the third duct 143 are mutually connected at an intersection point 144.

When both the first gas source 120 and the second gas source 130 are turned on, hydrogen gas as the first cleaning agent C1 is supplied from the first gas source 120 to flow through the first duct 141 and oxygen gas as the second cleaning agent C2 is supplied from the second gas source 130 to flow through the second duct 142. Since the first duct 141, the second duct 142 and the third duct 143 are mutually connected at the intersection point 144 as mentioned above, the hydrogen gas as the first cleaning agent C1 flowing through the first duct 141 and the oxygen gas as the second cleaning agent C2 flowing through the second duct 142 will mix together at the intersection point 144 of the duct assembly 140. Afterwards, hydrogen gas as the first cleaning agent C1 and oxygen gas as the second cleaning agent C2 mix and flow together through the third duct 143 towards the inlet 115 of the collector 110. In other words, hydrogen gas as the first cleaning agent C1 and oxygen gas as the second cleaning agent C2 are mixed before reaching the reflective surface 111 through the inlet 115 and the perimeter 113 of the collector 110.

In addition, as shown in FIG. 2, the lithography apparatus 100 further includes a first control valve 150 and a second control valve 155. The first control valve 150 is disposed on the first duct 141 of the duct assembly 140, and the first control valve 150 is configured to control a flow rate of hydrogen gas from the first gas source 120 to the inlet 115 of the collector 110. On the other hand, the second control valve 155 is disposed on the second duct 142 of the duct assembly 140, and the second control valve 155 is configured to control a flow rate of oxygen gas from the second gas source 130 to the inlet 115 of the collector 110.

As mentioned above, the total amount of oxygen gas supplied to the reflective surface 111 of the collector 110 is smaller than the total amount of the hydrogen gas supplied to the reflective surface 111 of the collector 110 with the same period of time. In practice, the first control valve 150 controls to allow a relatively higher flow rate of hydrogen gas from the first gas source 120 to the reflective surface 111 of the collector 110 through the inlet 115 and the perimeter 113, and the second control valve 155 controls to allow a relatively lower flow rate of oxygen gas from the second gas source 130 to the reflective surface 111 of the collector 110 through the inlet 115 and the perimeter 113.

In order to monitor the control of flow rates of hydrogen gas and oxygen gas to the reflective surface 111 of the collector 110 through the inlet 115 and the perimeter 113, in some embodiments, the lithography apparatus 100 further includes a first flow meter 160 and a second flow meter 165. As shown in FIG. 2, the first flow meter 160 is disposed on the first duct 141 of the duct assembly 140, and the first flow meter 160 is configured to measure and thus monitor the flow rate of hydrogen gas from the first gas source 120 to the reflective surface 111 of the collector 110 through the inlet 115 and the perimeter 113. On the other hand, the second flow meter 165 is disposed on the second duct 142 of the duct assembly 140, and the second flow meter 165 is configured to measure and thus monitor the flow rate of oxygen gas from the second gas source 130 to the reflective surface 111 of the collector 110 through the inlet 115 and the perimeter 113. It should be noted that, in order to accurately control the ratio of the total amount of hydrogen gas and the total amount of oxygen gas supplied to the reflective surface 111 of the collector 110 for a better cleaning effect, the flow rate of hydrogen gas supplied from the first gas source 120 and the flow rate of oxygen gas supplied from the second gas source 130 are respectively measured and thus monitored by the first flow meter 160 and the second flow meter 165 before the hydrogen gas and the oxygen gas are mixed at the intersection point 144 of the duct assembly 140.

In addition, in some embodiments, the lithography apparatus 100 further includes a processor 170. As shown in FIG. 2, the processor 170 is signally connected to the first flow meter 160, the second flow meter 165, the first control valve 150 and the second control valve 155. In practice, the processor 170 is configured to adjust the first control valve 150 according to the flow rate of hydrogen gas as measured by the first flow meter 160. On the other hand, the processor 170 is also configured to adjust the second control valve 155 according to the flow rate of oxygen gas as measured by the second flow meter 165.

As mentioned above, the flow rate of hydrogen gas supplied to the reflective surface 111 of the collector 110 is about 50,000 to about 60,000 times more than the flow rate of oxygen gas supplied to the reflective surface 111 of the collector 110. In practice, according to the flow rate of hydrogen gas as measured by the first flow meter 160, for example, the first control valve 150 is adjusted such that the maximum flow rate of hydrogen gas allowed to flow to the reflective surface 111 of the collector 110 is about 50 to about 60 standard liter per minute. On the other hand, according to the flow rate of oxygen gas as measured by the second flow meter 165, the second control valve 165 is correspondingly adjusted such that the maximum flow rate of oxygen gas allowed to flow to the reflective surface 111 of the collector 110 is about 0.0008 to about 0.0012 standard liter per minute. In this case, the flow rate of hydrogen gas supplied to the reflective surface 111 of the collector 110 is about 50,000 to about 60,000 times more than the flow rate of oxygen gas supplied to the reflective surface 111 of the collector 110 with the same period of time.

In addition, in some embodiments, the lithography apparatus 100 further includes a first check valve 180 and a second check valve 185. As shown in FIG. 2, the first check valve 180 is disposed on the first duct 141 of the duct assembly 140, and the first check valve 180 is configured to prevent the hydrogen gas from flowing back to the first gas source 120. In other words, the first check valve 180 allows only a flow direction of hydrogen gas away from the first gas source 120 towards the reflective surface 111 of the collector 110 through the inlet 115 and the perimeter 113. On the other hand, the second check valve 185 is disposed on the second duct 142 of the duct assembly 140, and the second check valve 185 is configured to prevent the oxygen gas from flowing back to the second gas source 130. In other words, the second check valve 185 allows only a flow direction of oxygen gas away from the second gas source 130 towards the reflective surface 111 of the collector 110 through the inlet 115 and the perimeter 113.

As mentioned above, hydrogen gas as the first cleaning agent C1 flowing through the first duct 141 and oxygen gas as the second cleaning agent C2 flowing through the second duct 142 mix together at the intersection point 144 of the duct assembly 140. In other words, the inner space of the first duct 141 and the inner space of the second duct 142 are fluidly communicated with each other at the intersection point 144 of the duct assembly 140. With the presence of the first check valve 180 disposed on the first duct 141 of the duct assembly 140, no oxygen gas from the second duct 142 is allowed to flow to the first gas source 120. Thus, the chance that oxygen gas flowing to the first gas source 120 which may affect the supply of hydrogen gas by the first gas source 120 is effectively avoided. On the other hand, with the presence of the second check valve 185 disposed on the second duct 142 of the duct assembly 140, no hydrogen gas from the first duct 141 is allowed to flow to the second gas source 130. Thus, the chance that hydrogen gas flowing to the second gas source 130 which may affect the supply of oxygen gas by the second gas source 130 is effectively avoided.

During the plasma generation and vaporization of the solder droplets in the operation of the lithography apparatus, solder particles, or debris, as contaminants may be produced and deposited subsequently on the reflective surface of the collector. In order to have a better cleaning effect to recover the reflectivity of the collector and increase the lifetime of the collector, apart from hydrogen gas as the major cleaning agent, oxygen gas is also utilized intermittently as the minor cleaning agent in order to effectively remove the solid solder particles, or debris, deposited on the reflective surface of the collector to recover the reflectivity of the collector. That is, the supply of oxygen gas is applied and stopped alternatively during the cleaning process based on the cumulative counts of the solder droplets provided by the droplet generator of the lithography apparatus. In the situation when both the first gas source of hydrogen gas and the second gas source of oxygen gas are turned on, the total amount of the oxygen gas supplied to the reflective surface of the collector is smaller than the total amount of the hydrogen gas supplied to the reflective surface of the collector. In practical applications, the flow rate of hydrogen gas supplied to the reflective surface of the collector is about 50,000 to about 60,000 times more than the flow rate of oxygen gas supplied to the reflective surface of the collector.

According to the aforementioned embodiments, a method for cleaning a lithography apparatus is provided. The method includes flowing a first cleaning agent over a reflective surface of a collector of the lithography apparatus; and flowing a second cleaning agent intermittently over the reflective surface.

According to the aforementioned embodiments, a method for cleaning a lithography apparatus is provided. The method includes flowing hydrogen gas as a major cleaning agent in volume over a reflective surface of a collector of the lithography apparatus; and flowing oxygen gas as a minor cleaning agent in volume over the reflective surface.

According to the aforementioned embodiments, a lithography apparatus includes a collector, a first gas source and a second gas source. The collector has a reflective surface and a perimeter surrounding the reflective surface. The collector further has an inlet located on the perimeter. The first gas source communicates with the inlet to supply a first cleaning agent to the reflective surface through the inlet. The second gas source communicates with the inlet to supply a second cleaning agent intermittently to the reflective surface through the inlet.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method, comprising:
    emitting droplets by a droplet generator of a lithography apparatus;
    starting flow of a first cleaning agent over a reflective surface of a collector of the lithography apparatus;
    starting flow of a second cleaning agent over the reflective surface and continuing the flow of the first cleaning agent in response to a cumulative count of the droplets emitted by the droplet generator of the lithography apparatus reaching a first predetermined count, wherein the flow of the first cleaning agent is started before the flow of the second cleaning agent is started; and stopping the flow of the second cleaning agent and continuing the flow of the first cleaning agent in response to the cumulative count of the droplets emitted by the droplet generator of the lithography apparatus reaching a second predetermined count, wherein the second predetermined count is greater than the first predetermined count.

2. The method of claim 1, wherein a total amount of the second cleaning agent supplied to the reflective surface is smaller than a total amount of the first cleaning agent supplied to the reflective surface with a period of time.

3. The method of claim 1, wherein starting the flow of the second cleaning agent comprises:
turning off the flow of the second cleaning agent for a period of time.

4. The method of claim 1, wherein a maximum flow rate allowed for the second cleaning agent is about 0.0008 to about 0.0012 standard liter per minute.

5. The method of claim 1, wherein a maximum flow rate allowed for the first cleaning agent is about 50 to about 60 standard liter per minute.

6. The method of claim 1, wherein the first cleaning agent comprises hydrogen, the second cleaning agent comprises oxygen, and a flow rate of the second cleaning agent is less than a flow rate of the first cleaning agent.

7. The method of claim 1, wherein the second cleaning agent is extreme clean dry air.

8. The method of claim 1, wherein the flow of the first cleaning agent is started by a first gas source, and the first cleaning agent and the second cleaning agent are mixed downstream of the first gas source.

9. The method of claim 8, wherein the flow of the second cleaning agent is started by a second gas source, and the first cleaning agent and the second cleaning agent are mixed downstream of the second gas source.

10. The method of claim 8, wherein the first cleaning agent and the second cleaning agent are mixed before the second cleaning agent flows over the collector.

11. A method, comprising:
emitting droplets by a droplet generator of a lithography apparatus;
starting flow of hydrogen gas as a major cleaning agent in volume over a reflective surface of a collector of the lithography apparatus;
starting flow of oxygen gas as a minor cleaning agent in volume over the reflective surface and continuing the flow of the hydrogen gas;
turning off the flow of the oxygen gas and continuing the flow of the hydrogen gas in response to a cumulative count of the droplets emitted by the droplet generator of the lithography apparatus reaching a first predetermined count;
starting the flow of the oxygen gas again over the reflective surface and continuing the flow of the hydrogen gas in response to the cumulative count of the droplets emitted by the droplet generator of the lithography apparatus reaching a second predetermined count, wherein the second predetermined count is greater than the first predetermined count; and
turning off the flow of the oxygen gas again and continuing the flow of the hydrogen gas in response to the cumulative count of the droplets emitted by the droplet generator of the lithography apparatus reaching a third predetermined count, wherein the third predetermined count is greater than the second predetermined count.

12. The method of claim 11, further comprising:
respectively monitoring a flow rate of the hydrogen gas and a flow rate of the oxygen gas before the hydrogen gas and the oxygen gas are mixed.

13. The method of claim 12, wherein the flow rate of the hydrogen gas is about 50,000 to about 60,000 times more than the flow rate of the oxygen gas.

14. The method of claim 11, wherein the hydrogen gas keeps flowing over the reflective surface of the collector of the lithography apparatus after turning off the flow of the oxygen gas.

15. The method of claim 11, wherein a total amount of the oxygen gas supplied to the reflective surface is smaller than a total amount of the hydrogen gas supplied to the reflective surface with a period of time.

16. A lithography apparatus, comprising:
a collector having a concave reflective surface and a sidewall extending downwards from an upper perimeter of the reflective surface;
a guiding plate having a first portion extending along while separated from the sidewall of the collector, and extending past the upper perimeter of the reflective surface; a second portion with first and second ends, the second portion being substantially flat and extending starting from the first end thereof laterally from a top of the first portion and beyond the sidewall of the collector; and a third portion extending downwards from the second end of the second portion, wherein an end of the third portion distal to the second end of the second portion is below the upper perimeter of the reflective surface, and the guiding plate and the collector define an inlet;
a first duct;
a second duct;
a third duct in fluid communication with the inlet of the collector, wherein the first duct, the second duct, and the third duct are connected at a junction that is external to the collector;
a first gas source in fluid communication with the first duct and configured to supply a first cleaning agent to the reflective surface through the first duct, the third duct, and the inlet; and
a second gas source in fluid communication with the second duct and configured to supply a second cleaning agent intermittently to the reflective surface through the second duct, the third duct, and the inlet.

17. The lithography apparatus of claim 16, further comprising a control valve connected between the first gas source and the junction.

18. The lithography apparatus of claim 16, wherein an obtuse angle is between the second and third portions of the guiding plate.

19. The lithography apparatus of claim 16, wherein the guiding plate further has a fourth portion below the collector.

20. The lithography apparatus of claim 19, wherein the inlet extends to the fourth portion of the guiding plate.

* * * * *